United States Patent
Shealy et al.

(10) Patent No.: US 6,478,871 B1
(45) Date of Patent: Nov. 12, 2002

(54) SINGLE STEP PROCESS FOR EPITAXIAL LATERAL OVERGROWTH OF NITRIDE BASED MATERIALS

(75) Inventors: James R. Shealy, Ithaca, NY (US); Joseph A. Smart, Auburn, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 09/676,938

(22) Filed: Oct. 2, 2000

Related U.S. Application Data
(60) Provisional application No. 60/157,047, filed on Oct. 1, 1999.

(51) Int. Cl.[7] .............................................. C30B 25/04
(52) U.S. Cl. .............................. 117/84; 117/94; 117/95; 117/951
(58) Field of Search .............................. 117/84, 95, 96, 117/951

(56) References Cited

U.S. PATENT DOCUMENTS

| | | | |
|---|---|---|---|
| 5,828,088 A | * 10/1998 | Mauk | 257/98 |
| 6,051,849 A | * 4/2000 | Davis et al. | 257/103 |
| 6,111,276 A | * 8/2000 | Mauk | 257/98 |
| 6,121,121 A | * 9/2000 | Koide | 438/481 |

* cited by examiner

*Primary Examiner*—Robert Kunemund
(74) *Attorney, Agent, or Firm*—Jones, Tullar & Cooper PC

(57) ABSTRACT

An epitaxial deposition process produces epitaxial lateral overgrowth (ELO) of nitride based materials directly a patterned substrate (10). The substrate (10) is preferably formed from SiC or sapphire, and is patterned with a mask (12), preferably formed of silicon nitride, having a plurality of openings (13) formed therein. A nucleation layer (14), preferably formed of AlGaN, is grown at a high reactor temperature of 700–1100 degrees C., which wets the exposed substrate surface, without significant nucleation on the mask (12). This eliminates the need for regrowth while producing smooth growth surfaces in the window openings (13) as well as over the mask (12). Subsequent deposition of a nitride based material layer (16), preferably GaN, results in a relatively defect free planar surfaced material grown laterally over the mask (12).

20 Claims, 1 Drawing Sheet

SINGLE STEP PROCESS FOR EPITAXIAL LATERAL OVERGROWTH OF NITRIDE BASED MATERIALS

CROSS REFERENCE TO RELATED APPLICATIONS

This application claims priority, under 35 USC 119 (e), on U.S. Provisional Application No. 60/157,047, filed Oct. 1, 1999.

This invention was made with Government support from the Advanced Research Projects Agency (ARPA) under Contract No. DABT63-95-C-0121. The Government has certain rights in the invention.

BACKGROUND OF THE INVENTION

1. Field of the Invention

The present invention relates in general to a process for growth of nitride based materials on patterned substrates formed from SiC, sapphire and other materials.

2. Description of the Background Art

Since the report of improved performance and reliability of GaN-based laser diodes grown on epitaxial lateral overgrown (ELO) GaN on sapphire, there has been considerable interest in the deposition process and characterization of nitride materials grown in this fashion. It has been established that dislocation free GaN materials, within the observation limits of transmission electron microscopy (TEM), can be obtained in severely mismatched systems in regions where lateral overgrowth occurs. In these studies, $SiO_2$ masks are patterned on planar heteroepitaxial GaN growth surfaces formed by the deposition of relatively standard nucleation layers on either SiC or sapphire substrates. A multiple growth temperature Organometallic Vapor Phase Epitaxial (OMVPE) process is used regardless of the choice of substrate. Once the planar GaN surface is realized after an initial growth step, the $SiO_2$ mask is deposited and patterned, and the substrate is returned to the OMVPE reactor for a second regrowth step.

A drawback to this process is the need to remove the substrate from the reactor chamber during the mask deposition and patterning process, and then return the substrate to the chamber for the subsequent regrowth step. However, these steps cannot be eliminated because the GaN will grow on the masking material if attempted directly on a patterned substrate in a single step. This is due to the commonly accepted nucleation schemes employed, which initiates GaN-based crystal growth at temperatures in the range of 400–600° C. This approach deposits an amorphous film on both the masking material and the window opening that requires re-crystallization at higher temperatures, typically above 1000° C. This conformal coating does not allow lateral overgrowth to take place and is therefore undesirable.

SUMMARY OF THE INVENTION

The present invention overcomes the drawbacks to the regrowth technique through provision of a single nucleation step process for growth of ELO materials on lattice mismatched substrates. The regrowth step is avoided by initiating the growth process on substrates that have a mask layer formed directly on them, rather than on an initial growth layer. The masked substrates are exposed to an ELO growth process wherein a first layer of nitride based material is grown in the mask openings, thereby forming nucleation sites on the substrate. Then, either continued growth of the layer, or growth of an additional layer of nitride based material material occurs until a planar surface is formed.

In a preferred embodiment, an SiC, sapphire or other suitable material substrate is first patterned with an mask layer, preferably formed of $Si_3N_4$. The $Si_3N_4$ mask material is preferred for this process because AlGaN used in a subsequent nucleation step is less likely, through thermodynamic arguments, to grow on the masked surface than the more commonly used $SiO_2$ mask. The patterning forms rows of apertures or window openings for subsequent growth of nitride based materials, including GaN, InN, AlN or their related alloys, until a planar film is achieved.

The ELO growth process is preferably carried out by any conventional epitaxial growth technique in a reactor chamber at a temperature of 700–1100° C. The high temperature is important to insure that initial material growth will only occur in the mask openings. First, the nucleation step is carried out by growing a layer of nitride based material preferably AlGaN, in the mask openings until lateral overgrowth occurs such that a mushroom shaped cap is formed above each of the openings that overlaps the mask. The growth process is then continued, preferably by forming a layer of GaN or other nitride based material that covers the AlGaN caps, and gradually spreads up and out (growing laterally) until the adjacent rows of growth merge into a single layer. Eventually, continued growth of the GaN layer results in formation of a planar GaN surface that is now suitable for use as a substrate for GaN based devices.

BRIEF DESCRIPTION OF THE DRAWINGS

The foregoing and other features and advantages of the present invention will become apparent from the following detailed description of a preferred embodiment thereof taken in conjunction with the accompanying drawings, in which:

FIG. 2 showing the substrate after growth of a nucleation layer thereon;

FIG. 3 showing initial growth of a nitride based material layer on the nucleation layer;

FIG. 4 showing continued growth of the nitride based material layer where adjacent portions of the layer merge together; and, FIG. 5 showing a finished structure with a planar surface.

DETAILED DESCRIPTION OF A PREFERRED EMBODIMENT

Figure 1:
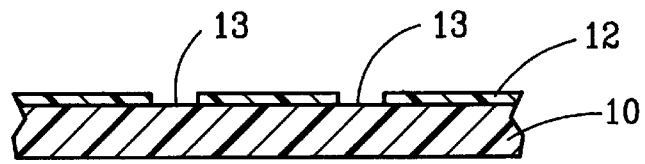
FIGS. 1–5 are schematic illustrations of a nitride based material structure fabrication process in accordance with a preferred embodiment of the present invention, with FIG. 1 showing a substrate after an initial masking step.

Turning now to a more detailed consideration of the invention, FIGS. 1–5 show the various steps that are carried out to form a planar, nitride based material surface on a patterned substrate in accordance with a preferred embodiment of the invention. Referencing first FIG. 1, a substrate 10, preferably formed of SiC, sapphire, or other material that is lattice mismatched to a nitride based material to be grown thereon, is first patterned by being coated with a mask layer 12, preferably formed from a thin (e.g., 700 Å thick) $Si_3N_4$ film using plasma enhanced chemical vapor deposition (PECVD). The mask layer 12 is preferably patterned using standard photolithographic techniques in arrays of stripes consisting of a plurality of spaced openings 13. In experiments conducted to test the process of the present invention, the openings 13 were selected to be 2 μm in diameter on a 12 μm pitch form one another. The narrow openings were chosen to minimize ridge growth at the mask edges from lateral vapor diffusion, resulting in flat (0001) growth surfaces.

Next, the patterned substrate 10 is subjected to an ELO growth process. In the preferred embodiment, the ELO process is carried out in a reactor at a fixed susceptor temperature of between 700 and 1100° C. with hydrogen and ammonia mixtures as the carrier gas in a quartz reaction cell or chamber maintained at low pressure (e.g., 76 torr). The high temperature is important to insure that growth will not initially occur on the surfaces of the mask 12. It should also be noted, that the crystal growth can be carried out by any conventional means such as organometallic vapor phase epitaxy, molecular beam epitaxy, or atomic layer epitaxy. Techniques can involve flow (beam) modulation, growth at atmospheric or reduced pressures, as well as various precursor chemistries that are widely accepted in the industrial and research communities.

In the preferred embodiment, an AlGaN nucleation layer 14 is first deposited to a thickness of roughly 2000 Å. This layer insures smooth growth in the mask openings 13 by uniformly wetting the exposed portions of the substrate 10. In the experiments, the $Al_xGa_{1-x}N$ (x less than or equal to 0.3) was not observed to nucleate on the $Si_3N_4$ mask 12 in contrast to experiments carried out simultaneously on substrates using a PECVD $SiO_2$ mask. The AlGaN deposition on the $SiO_2$ mask can be explained by thermodynamic arguments for the reaction between Al and $SiO_2$. This explains the success of $SiO_2$ masks in homoepitaxial GaN ELO using the prior art regrowth method, and why $SiO_2$ is unsuitable for Al bearing alloys. In addition, measured $Al_xGa_{1-x}N$ (x less than or equal to 0.3) migration lengths, taken to be the average distance over the mask from a patterned edge to polycrystalline deposits, increased from about 85 $\mu$m to 150 $\mu$m for growth on $SiO_2$ and $Si_3N_4$ respectively, indicating that AlGaN reacts more readily with $SiO_2$.

A minimal Al content in the AlGaN is required for successful nucleation, and differs slightly between SiC and sapphire substrates. In particular, a minimum of 6% and 15% aluminum content is required for growth on SiC and sapphire substrates, respectively. An upper limit on the aluminum content has not been established, but is conceivable to be applicable up to 100% aluminum, resulting in pure AlN as the starting nucleation layer 14. In addition, it is envisioned that other nitride based materials can be used in the nucleation layer 14, including GaN, InN and their alloys.

Figure 2:
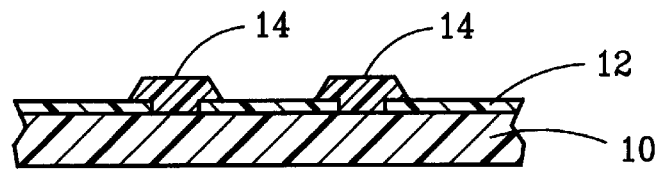

When optimal nucleation conditions are met, atomically smooth AlGaN growth occurs within the first several hundred angstroms across the entire window opening 13, providing the needed crystalline structure for subsequent GaN deposition. As illustrated in FIG. 2, lateral overgrowth occurs as the AlGaN layer 14 is grown, thereby resulting in a mushroom shaped cap, or truncated trapezoid structure. In the experiments on the invention, no ridge growth was observed at the mask edges, resulting in flat (0001) growth surfaces. In addition, the top surface of the cap was atomically flat across the entire structure. Threading dislocations densities near $10^9$ cm$^{-2}$ were estimated from AFM images, with no noticeable defect density reduction in the 2000 Å AlGaN ELO regions.

Insufficient Al composition (below 6% on SiC and 15% on sapphire) in the nucleation layer 14 results in three dimensional growth over the window openings 13, but still produces ELO regions with smooth (0001) surfaces over the mask 12. The ELO located at the mask edges is caused by a localized increase in Al incorporation caused by lateral diffusion over the mask 12, and/or preferential nucleation near the mask sidewalls. Thereby, achieving the minimal required Al composition (approximately 15%) is necessary for smooth growth on the bare sapphire substrate 10. The average thickness of the rough growth over the mask openings 13 is about 100 nm less than the side ELO regions. If growth is continued, the thicker ELO regions will eventually grow laterally over the opening region, producing a planar film over a very defective section.

The irregularity of the <1$\bar{1}$01> sidewalls noted during the experiments is caused by damage to the mask 12, and is present using either the single step process with an AlGaN nucleation layer or the prior art regrowth process using GaN only on a patterned GaN buffer layer. This eliminates the possibility of damage from Al reacting with the mask sidewalls during initial stages of growth. The mask 12 is most likely being damaged in the lift-off process, or by the substrate preparation prior to growth.

Figure 3:
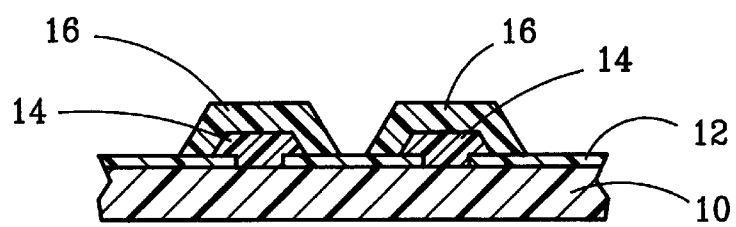
Figure 4:
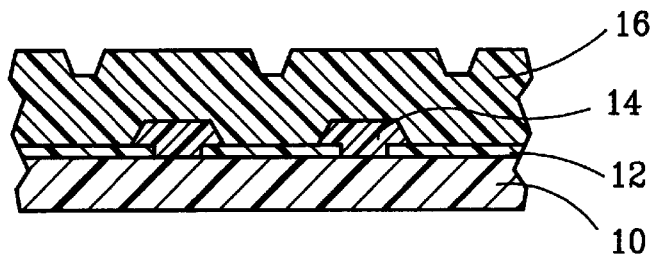
Figure 5:
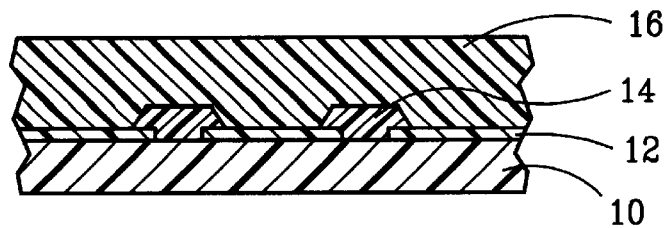

After the nucleation layer 14 is grown and the mushroom shaped caps are formed thereby, a layer of nitride based material 16, preferably GaN, is then deposited on the optimized AlGaN ELO structures as illustrated in FIGS. 3–5. Growth continues both laterally and vertically retaining the original trapezoidal shape of the nucleation layer 14 with a vertical to lateral growth rate of around 1:1.5. In the experiments, the V/III ratio was doubled to 1800 during the GaN growth as the lateral growth rate is reported to increase with ammonia flow. Flow modulation was accomplished by rotating the substrates through a group-III (triethylgallium and trimethylaluminum in our case) rich growth zone resulting in roughly a 25% duty cycle, while a background of ammonia is supplied for the remaining rotation period. By using this growth technique, the process is easily scalable for multi-wafer runs.

For comparison purposes, a GaN homoepitaxial lateral overgrowth sample was grown on a patterned GaN buffer layer. In this case, a planar 1 $\mu$m GaN buffer layer on 6H—SiC was coated with 700 Å of $Si_3N_4$, patterned, and then subjected to a GaN regrowth step. The growth features were found to be nearly identical to those achieved with the one step nucleation process of the present invention. AFM studies showed threading dislocation densities in the mid $10^8$cm$^{-2}$ for regions over the mask openings, and no defects observable in the relatively narrow (0001) ELO regions for both growth methods. This verifies that the single step nucleation process produces similar defect reductions as the convention regrowth methods. In both cases, no growth was observed on the $Si_3N_4$ mask 12.

If growth of the nitride based material layer 16 is allowed to proceed, the trapezoidal structures begin to merge into each other as illustrated in FIG. 4, and then eventually coalesce into a planar film after roughly 5 $\mu$m of deposition in the (0001) direction as illustrated in FIG. 5. The <1$\bar{1}$01> sidewalls meet, resulting in a void free merging of the two ELO regions. Also, in the experiments, no voids were detected over the window opening, that are usually present if the Al composition of the nucleation layer is too low. Bi-layer stepped surfaces were observed over the entire ELO regions. Being on sapphire, the threading defect density is usually higher than on SiC substrates, and was estimated from AFM images to be $10^9$ cm$^{-2}$ above the window openings. Examining ELO regions over a 16 mm$^2$ area, the threading dislocation densities were estimated to be reduced below $10^5$ cm$^{-2}$. There was also a ±30 Å ripple across the surface which peaks over the window openings and at a minimum where the two ELO growth regions meet. The planarized film still had a signature of the trapezoidal growth features merging in the center of the masked area. Further deposition would must likely minimize or eliminate this ripple.

In summary, the experiments confirm that by applying the single step nucleation process to patterned SiC and sapphire substrates, similar defect reduction can be obtained by GaN lateral overgrowth as in conventional regrowth techniques. A high temperature AlGaN nucleation layer is used, which wets the exposed substrate with minimal deposition on the $Si_3N_4$ mask. Subsequent AlGaN or GaN growth produced atomically flat surfaces over both the window opening and mask regions. GaN ELO grown in stripes (2 $\mu$m openings on 12 $\mu$m centers) oriented along the <1$\underline{1}$00> direction produced truncated trapezoid structures that eventually coalesced into planar films after roughly 5 $\mu$m of vertical (0001) growth. Threading dislocations were estimated from AFM images to be close to $10^9$ $cm^{-2}$ above the window opening and less than $10^5$ $cm^{-2}$ over the masked regions. This single step ELO process yields comparable defect reduction to the conventional regrowth techniques commonly used. Materials grown by this method exhibit similar growth features and materials quality as those grown with the conventional method requiring regrowth, yet the process is greatly simplified.

Although the invention has been disclosed in terms of a preferred embodiment and variations thereon, it will be understood that additional modifications and variations could be made thereto without departing from the scope of the invention as defined in the following claims. For example, as noted above, it is envisioned that the single step nucleation process can be employed with numerous nitride based materials. In addition, the nucleation layer 14 and the nitride based material layer 16 can be formed of the same material, in which case, the entire growth can occur in a single step, and the two layers 14 and 16 would effectively be combined into a single layer.

What is claimed is:

1. A method for growing a planar surfaced nitride based material on a lattice mismatched substrate comprising the steps of:
    a) providing a substrate formed from a first material;
    b) forming a patterned mask layer on said substrate, said mask layer having a plurality of openings disposed therein;
    c) growing a first, nucleation layer of nitride based material in said openings and on said substrate until said layer grows laterally over a portion of said mask layer, said nitride based material being lattice mismatched with said first material, such nucleation layer being grown at a temperature of 700–1100 degrees C.; and
    d) growing a second layer of nitride based material on said nucleation layer until a top surface of said second layer becomes planar.

2. The method of claim 1, wherein said substrate is selected to be formed from SiC or sapphire.

3. The method of claim 1, wherein said mask layer is selected to be formed from silicon nitride.

4. The method of claim 1, wherein said nucleation layer is formed from a material selected from the group comprising GaN, InN, AlN and their alloys.

5. The method of claim 4, wherein said nucleation layer is formed from AlGaN.

6. The method of claim 1, wherein said second layer is formed from a material selected from the group comprising GaN, InN, AlN, and their alloys.

7. The method of claim 6, wherein said second layer is formed from GaN.

8. The method of claim 1, wherein said nucleation layer is formed from AlGaN and said second layer is formed from GaN.

9. The method of claim 8, wherein said substrate is formed from SiC, and said AlGaN nucleation layer contains at least 6% Al.

10. The method of claim 8, wherein said substrate is formed from sapphire, and said AlGaN nucleation layer contains at least 15% Al.

11. A structure for formation of nitride based semiconductor devices comprising:
    a) a substrate formed of a first material;
    b) a mask layer formed on said substrate, and having a plurality of openings formed therein;
    c) a first, nucleation layer formed of nitride based material that is lattice mismatched with said first material, and is grown in said openings and on said substrate, and includes a plurality of laterally overgrown portions extending over at least a portion of said mask layer; and
    d) a second layer formed of a nitride material that is laterally overgrown over said first layer and said mask layer, and includes a planar top surface.

12. The structure of claim 11, wherein said substrate is formed from SiC or sapphire.

13. The structure of claim 11, wherein said first and second layers are formed from materials selected from the group comprising GaN, InN, AlN and their alloys.

14. The structure of claim 13, wherein said nucleation layer is formed from AlGaN, and said second layer is formed from GaN.

15. The structure of claim 14, wherein said substrate is formed from SiC, and said nucleation layer is formed from AlGaN that includes at least 6% Al.

16. The structure of claim 14, wherein said substrate is formed from SiC, and said nucleation layer is formed from AlGaN that includes at least 15% Al.

17. A method for growing a planar surfaced nitride based material on a lattice mismatched substrate comprising the steps of:
    a) providing a substrate formed from a first material;
    b) forming a patterned mask layer on said substrate, said mask layer having a plurality of openings disposed therein;
    c) growing a layer of nitride based material in said openings and on said substrate until said layer grows laterally over a portion of said mask layer, said nitride based material being lattice mismatched with said first material, such layer being grown at a temperature of 700–1100 degrees C.; and
    d) continuing growth of said layer until a top surface thereof becomes planar.

18. The method of claim 17, wherein said substrate is formed from SiC or sapphire and said nitride based layer is formed from material selected from the group comprising GaN, InN, AlN and their alloys.

19. A structure for formation of nitride based semiconductor devices comprising:
    a) a substrate formed of a first material;
    b) a mask layer formed on said substrate, and having a plurality of openings formed therein; and
    c) a layer formed of nitride based material that is lattice mismatched with said first material, said layer being grown in said openings and on said substrate, including a plurality of laterally overgrown portions extending over said mask layer, and having a planar top surface.

20. The structure of claim 19, wherein said substrate is formed from SiC or sapphire and said nitride based layer is formed from material selected from the group comprising GaN, InN, AlN and their alloys.

* * * * *